(12) United States Patent
Clevenger et al.

(10) Patent No.: US 10,211,101 B2
(45) Date of Patent: Feb. 19, 2019

(54) REFLOW INTERCONNECT USING RU

(71) Applicant: INTERNATIONAL BUSINESS MACHINES CORPORATION, Armonk, NY (US)

(72) Inventors: Lawrence A. Clevenger, LaGrangeville, NY (US); Su Chen Fan, Cohoes, NY (US); Huai Huang, Clifton Park, NY (US); Koichi Motoyama, Clifton Park, NY (US); Wei Wang, Yorktown Heights, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/813,600

(22) Filed: Nov. 15, 2017

(65) Prior Publication Data
US 2018/0277432 A1    Sep. 27, 2018

Related U.S. Application Data

(63) Continuation of application No. 15/467,113, filed on Mar. 23, 2017.

(51) Int. Cl.
*H01L 21/76* (2006.01)
*H01L 21/768* (2006.01)
*H01L 23/532* (2006.01)

(52) U.S. Cl.
CPC .. *H01L 21/76882* (2013.01); *H01L 21/76843* (2013.01); *H01L 23/53257* (2013.01); *H01L 23/53266* (2013.01)

(58) Field of Classification Search
CPC ... H01L 23/53; H01L 23/532; H01L 23/5325; H01L 23/5326; H01L 23/53257;
(Continued)

(56) References Cited

U.S. PATENT DOCUMENTS 5,654,232 A    8/1997  Gardner
5,985,751 A *  11/1999 Koyama ........... H01L 21/76843
                                                 257/E21.29
(Continued)

FOREIGN PATENT DOCUMENTS

EP    1 094 504 A2    4/2001

OTHER PUBLICATIONS

Itoh, M. et al., "Cu filling of 10nm trenches by high-magnetic-field magnetron sputtering" Japanese Journal of Applied Physics (Apr. 2014) pp. 05GA04-1-05GA04-5, vol. 53.
(Continued)

*Primary Examiner* — Monica D Harrison
(74) *Attorney, Agent, or Firm* — Tutunjian & Bitetto, P.C.; Vazken Alexanian (57) ABSTRACT

A method for forming conductive structures for a semiconductor device includes depositing a reflow liner on walls of trenches formed in a dielectric layer and depositing a reflow material on the reflow liner. The reflow material is reflowed to collect in a lower portion of the trenches. The depositing and the reflowing steps are repeated until the trenches are aggregately filled with the reflow material. The reflow material is planarized to form conductive structures in the trenches.

18 Claims, 8 Drawing Sheets

(58) Field of Classification Search
CPC . H01L 23/53266; H01L 21/76; H01L 21/768; H01L 21/7688; H01L 21/76882; H01L 21/7684; H01L 21/76843
USPC ......................................................... 257/763
See application file for complete search history.

(56) References Cited

U.S. PATENT DOCUMENTS

| | | | |
|---|---|---|---|
| 6,204,179 B1 | 3/2001 | McTeer | |
| 6,747,354 B2* | 6/2004 | Kim | H01L 23/53223 257/750 |
| 6,830,998 B1 | 12/2004 | Pan et al. | |
| 6,861,350 B1 | 3/2005 | Ngo et al. | |
| 6,905,960 B2 | 6/2005 | Park et al. | |
| 7,060,571 B1 | 6/2006 | Ngo et al. | |
| 7,071,086 B2 | 7/2006 | Woo et al. | |
| 7,091,118 B1 | 8/2006 | Pan et al. | |
| 7,138,323 B2 | 11/2006 | Kavalieros et al. | |
| 7,217,611 B2 | 5/2007 | Kavalieros et al. | |
| 7,271,045 B2 | 9/2007 | Prince et al. | |
| 7,365,015 B2 | 4/2008 | Lin et al. | |
| 7,422,936 B2 | 9/2008 | Barns et al. | |
| 7,569,443 B2 | 8/2009 | Kavalieros et al. | |
| 7,663,237 B2 | 2/2010 | Peng et al. | |
| 7,667,278 B2 | 2/2010 | Cabral, Jr. et al. | |
| 7,687,911 B2* | 3/2010 | Dominguez | C23C 16/34 257/758 |
| 7,718,479 B2 | 5/2010 | Kavalieros et al. | |
| 7,754,552 B2 | 7/2010 | Barns et al. | |
| 8,614,106 B2 | 12/2013 | Lavoie et al. | |
| 2010/0078815 A1 | 4/2010 | Wang et al. | |
| 2014/0287577 A1 | 9/2014 | Emesh et al. | |
| 2015/0203961 A1 | 7/2015 | Ha et al. | |

OTHER PUBLICATIONS

Kokaze, Y. et al., "Performance of Integrated Cu Gap-Filling Process with Chemical Vapor Deposition Cobalt Liner" Japanese Journal of Applied Physics (May 2013) pp. 05FA01-1-05FA01-4, vol. 52.

Wen, L.G. et al., "Ruthenium Metallization for Advanced Interconnects" 2016 IEEE International Interconnect Technology Conference / Advanced Metallization Conference (IITC/AMC) (Jul. 2016) pp. 34-36.

Yang, C.-C. et al., "Low-Temperature Reflow Anneals of Cu on Ru" IEEE Electron Device Letters (Jun. 2011) pp. 806-808, vol. 32, No. 6.

Yang, C.-C. et al., "Characterization of Cu Reflows on Ru" IEEE Electron Device Letters (Oct. 2011) pp. 1430-1432, vol. 32, No. 10.

Zhang, X. et al., "Ruthenium Interconnect Resistivity and Reliability at 48 nm pitch" 2016 IEEE International Interconnect Technology Conference / Advanced Metallization Conference (IITC/AMC) (Jul. 2016) pp. 31-33.

List of IBM Patents or Patent Applications Treated as Related dated Nov. 15, 2017, 2 pages.

* cited by examiner

REFLOW INTERCONNECT USING RU

BACKGROUND

Technical Field

The present invention generally relates to semiconductor processing and devices, and more particularly to flowing interconnects to handle reduced dimensional configurations.

Description of the Related Art

Semiconductor processing is often guided by ever decreasing node sizes. As dimensions shrink, further challenges arise in many processing steps and structures. This includes interconnect structures, which as a result of reduced node size suffers from resistivity issues and formation issues. Interconnects with liner requirements for copper accelerate copper resistivity, which increases due to dimensional restrictions. At small dimensions (e.g., critical dimensions (CD) under 20 nm), interconnect fills with any kind of metal are very challenging. This is further complicated for high melting point metals, which are difficult to process, and their high temperature processing can result in damaging effects to surrounding materials and structures.

SUMMARY

In accordance with an embodiment of the present invention, a method for forming conductive structures for a semiconductor device includes depositing a reflow liner on walls of trenches formed in a dielectric layer and depositing a reflow material on the reflow liner. The reflow material is reflowed to collect in a lower portion of the trenches. The depositing and the reflowing steps are repeated until the trenches are aggregately filled with the reflow material. The reflow material is planarized to form conductive structures in the trenches.

Another method for forming conductive structures for a semiconductor device includes patterning a dielectric layer to form trenches for conductive structures in the dielectric layer; depositing a reflow liner on walls of the trenches formed in the dielectric layer; conformally depositing a reflow material on the reflow liner; reflowing the reflow material at a temperature below a melting point of the reflow material to collect in a lower portion of the trenches; repeating the conformally depositing and the reflowing steps until the trenches are aggregately filled with the reflow material; depositing an overburden layer of the reflow material over the aggregately filled trenches; annealing the reflow material in the overburden layer and the reflow material in the aggregately filled trenches; and planarizing the reflow material to form conductive structures in the trenches.

A conductive structure for a semiconductor device includes a reflow liner formed on walls of trenches in a dielectric layer. The reflow liner includes a metal that serves as a surface tension launch layer to enable reflow of a reflow material. The reflow material also includes a metal. An aggregated reflow material is formed on the reflow liner of the reflow material and collected in the trenches to aggregately form the conductive structure in the trenches.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention include methods and devices having high melting point metals employed for conductive structures. The conductive structures can include any type of metal line, via, single or dual damascene structure, etc. In useful embodiments, a reflow liner is set down before a high melting point metal to enable the reflow of a high melting point metal. In one embodiment, a thin tungsten (W) film is formed as a reflow liner to enable ruthenium (Ru) to reflow into small voids or into patterned regions (e.g., trench and via regions). The reflow liner and the high melting point metal are particularly useful with structures having critical dimensions (CDs) of less than about 20 nm, although larger structures are contemplated in accordance with aspects of the present invention.

In illustrative embodiments, W has a high melting point that provides the surface dynamics to enable Ru reflow at a low temperature (as compared to the Ru melting point). In this way, high melting point materials can be employed for metal structures without having to reach the high melting point temperature often needed to processing these high melting point materials.

In one embodiment, a dielectric material is patterned and etched to form dimensioned features, vias, trenches, etc. These features can include small dimensions (e.g., less than about 20 nm). A liner-less deposition can be performed to form a reflow liner. A high melting point metal is deposited over the reflow liner. The high melting point metal is not deposited to fill the trenches, but instead merely lines the trenches in a thin form, e.g., conformal deposition. The high melting point metal is reflowed on the reflow liner without reaching the melting point of the high melting point metal. The high melting point metal settles within the small dimensioned features. The high melting point metal collects within the trenches. The deposition and reflow steps are repeated so that the reflow of the high melting point metal accumulates to fill the small dimensioned featured with the high melting point metal.

In one embodiment, an overburden deposition and anneal are performed using the high melting point metal to ensure complete filling. The overburden is preferably removed by a low temperature planarization process. The planarized surface is then optionally covered by a cap layer or further processed to form interconnects from the high melting point metal. The high melting point metal can include Ru or similar high melting point metals. Ru has a high melting point, and is therefore not easy to deposit to completely fill the trenches or to reflow. However, in accordance with the present embodiments, W serves as a reflow liner and a surface tension launch layer to enable reflow at a temperature lower than the melting point of the high melting point metal (e.g., Ru).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
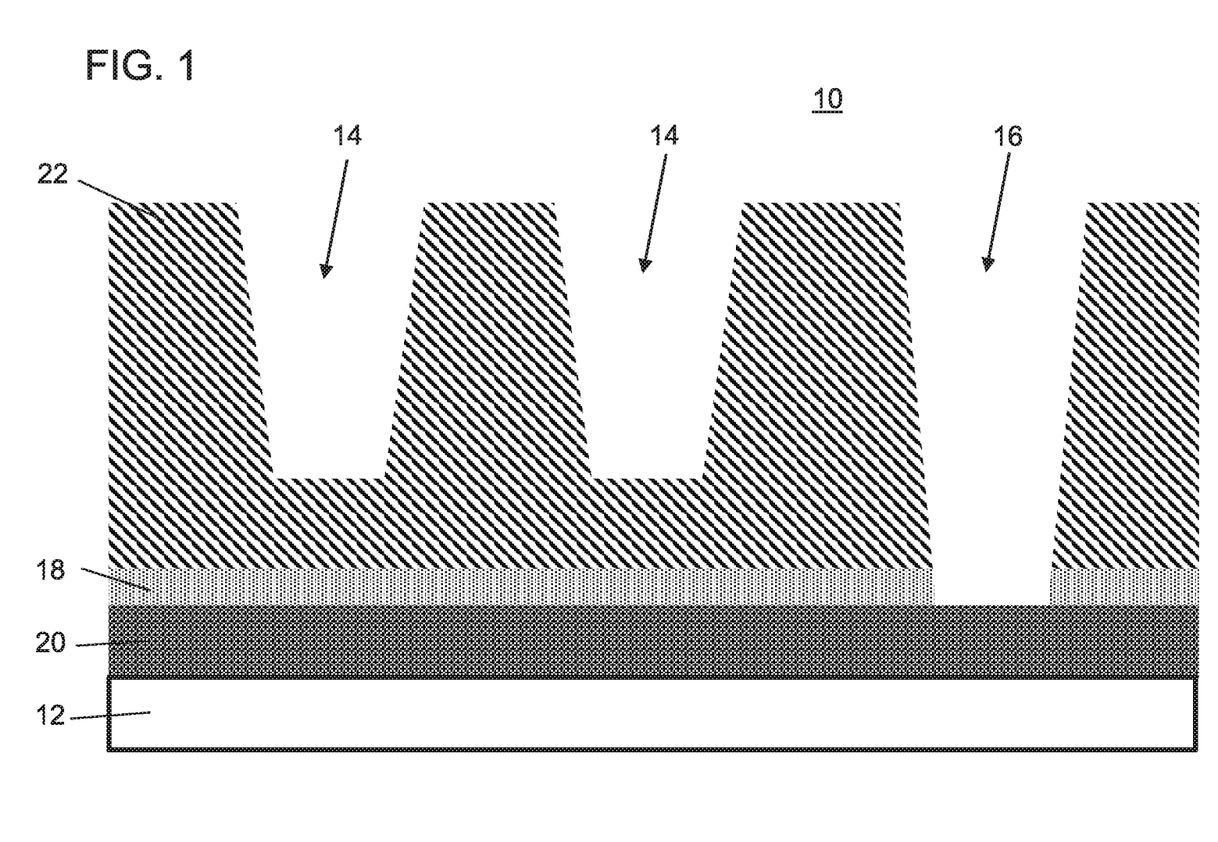
FIG. 1 is a cross-sectional view of a semiconductor device showing a dielectric layer patterned to form trenches or openings of different depths to form conductive structures in accordance with an embodiment of the present invention.

Referring now to the drawings in which like numerals represent the same or similar elements and initially to FIG. 1, a semiconductor device 10 is shown in accordance with one embodiment. The semiconductor device 10 can include any device having a conductive line, via, trench, interconnect or other conductive structure or structures. Such devices can include complementary metal oxide semiconductor (CMOS) devices) or any other type of semiconductor device. The device 10 includes a substrate 12 having one or more layers formed thereon. The substrate 12 can include any suitable substrate structure, e.g., a bulk semiconductor, a semiconductor-on-insulator (SOI) substrate, etc. In one example, the substrate 12 can include a silicon-containing material. Illustrative examples of Si-containing materials suitable for the substrate 12 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The substrate 12 can include dielectric layers, conductive layers or other semiconductor layers thereon. In the embodiment shown, a metal layer 20 is illustratively formed over the substrate 12. An interconnect can be formed to contact the metal layer 20. The metal layer 20 can include any suitable conductive material and, in particular, can include, e.g., copper (Cu), titanium (Ti), gold (Au), silver (Ag), platinum (Pt), Tungsten (W), alloys of these or other metals or any other suitable material.

A cap layer 18 can be formed on the metal layer 20. The cap layer 18 can be a diffusion liner, a dielectric layer, or another a conductive layer. Depending on the design, the cap layer 18 cap be employed as an etch stop for etching processes for forming a trench 16 in a dielectric layer 22. The cap layer 22 can include liner materials, such as e.g., Ta, Ti, TaN, TiN, etc. In other embodiments, the cap layer 18 can include SiN, an anti-reflection coating (ARC) or other dielectric materials. In still other embodiments, the cap layer 18 can include a metal and, with metal layer 20, form a metal bilayer.

The dielectric layer 22 can include an ultra-low dielectric constant material (ULK) or any other suitable dielectric. The dielectric layer 22 can include, oxides, such as silicon oxide, carbon doped oxides, organic dielectrics, nitrides, such as silicon nitride, etc. The dielectric layer 22 can be deposited or spun-on, as needed.

The dielectric layer 22 is patterned to form vias or trenches, which will be collectively referred to as openings 14, 16. The openings 14, 16 can include small dimensions (e.g., 20 nm or less). At small dimensions the present embodiments are particularly useful as the issues of shrinking critical dimensions can be directly addressed. Openings 14, 16 can include different depths. The openings 14, 16 at different depths can be processed concurrently or can be processed separately using blocking masks or the like. Advantages are provided when processing the trenches or openings 14, 16 concurrently as thermal budget is reduced.

The dielectric layer 22 can be patterned using lithographic processing, reverse image transfer, sidewall image transfer (SIT) or any other suitable patterning process. The openings 14, 16 can be etched using a reactive ion etch (RIE) process or other anisotropic etch process. Different etch masks may be employed and can employ blocking masks to form openings 14, 16 of different depths or sizes, as needed. In one instance, opening 16 includes the cap layer 20 removed by etching to expose the metal layer 18 for the formation of an interconnect. Opening 14 have a depth within the dielectric layer 22.

Figure 2:
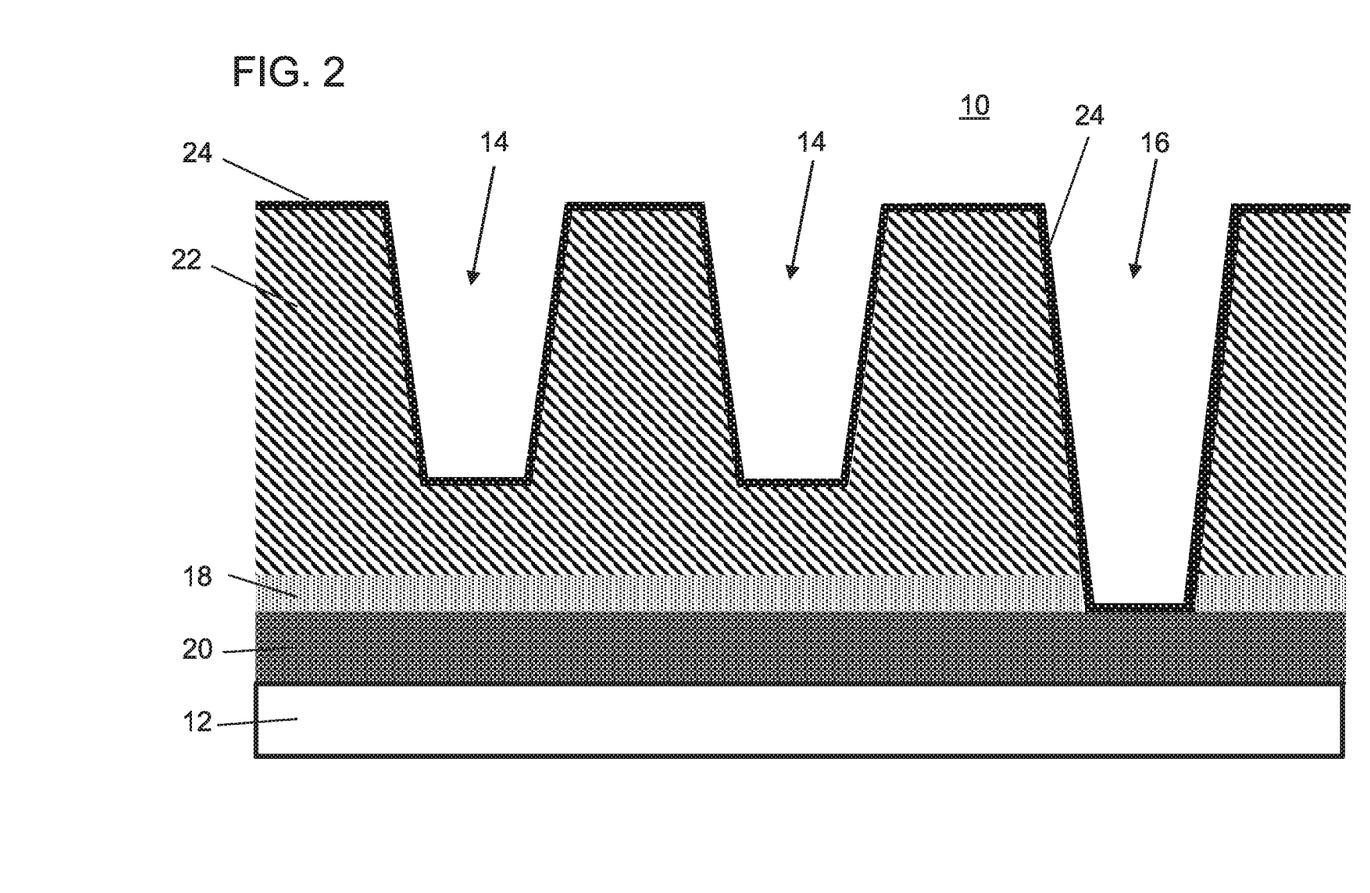
FIG. 2 is a cross-sectional view of the semiconductor device of FIG. 1 showing the trenches formed in the dielectric layer lined with a reflow liner to form conductive structures in the trenches or openings of different depths in accordance with an embodiment of the present invention.

Referring to FIG. 2, a reflow liner 24 is deposited to line the topography of the dielectric layer 22 and line the exposed portion of the metal layer 18. The reflow layer 24 can include W, although other high melting point temperature metals can be employed, e.g., niobium, (Nb) molybdenum (Mo), tantalum (Ta), rhenium (Re). High melting point includes a melting point of about 1850° C. or greater, although other melting points can be employed depending on the material selections. The reflow liner 24 can be formed by a liner-less deposition process to form the conformal reflow liner 24, although other deposition processes can be employed. These processes can include chemical vapor deposition, atomic layers deposition or other processes that can form a conformal or continuous layer of material. In one particularly useful embodiments, the reflow liner 24 includes W, which can be deposited in contact with metal layer 20 and over the trench walls of the dielectric layer 22.

Figure 3:
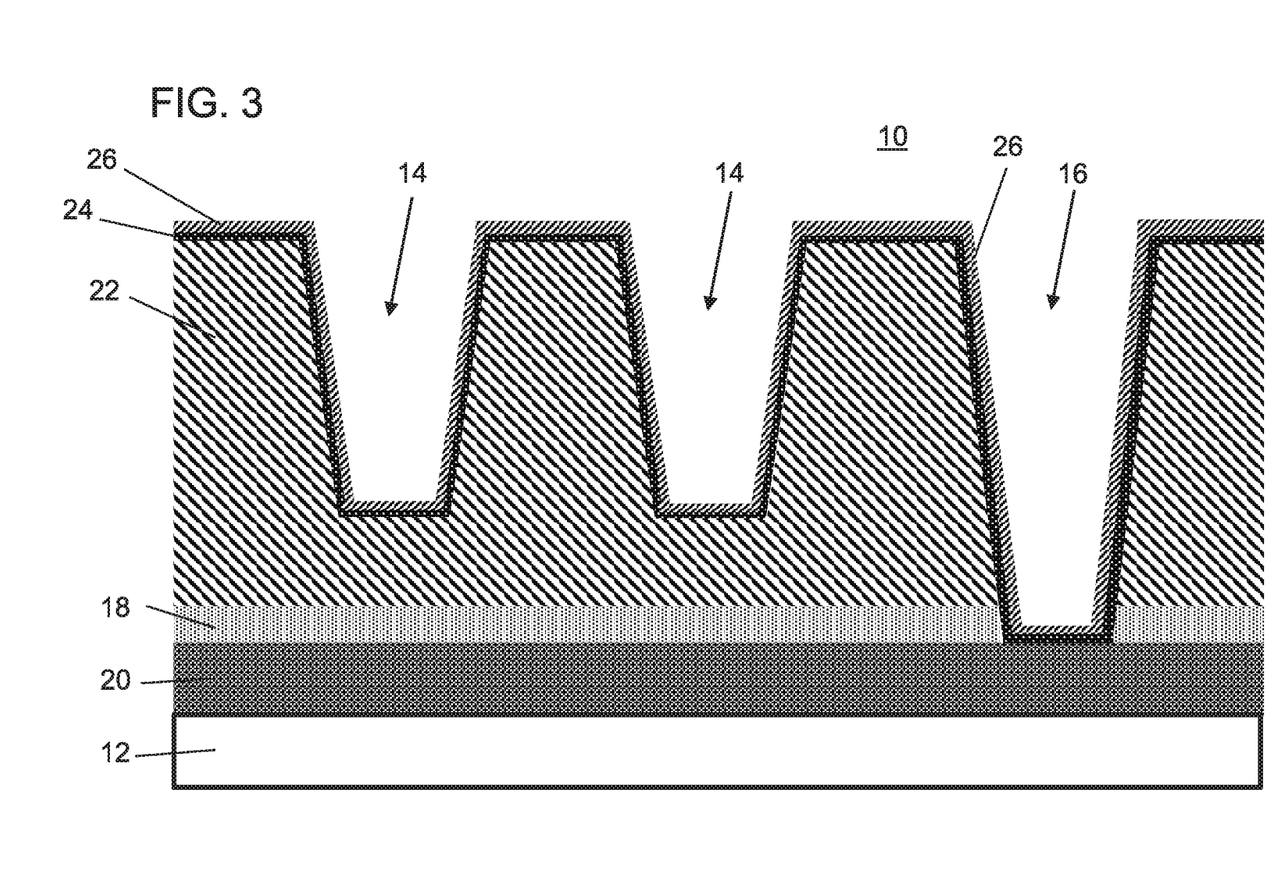
FIG. 3 is a cross-sectional view of the semiconductor device of FIG. 2 showing a reflow material conformally formed on the reflow liner to form conductive structures in the trenches or openings of different depths in accordance with an embodiment of the present invention.

Referring to FIG. 3, a reflow material 26 includes a conformally deposited metal. The reflow material 26 can include ruthenium (Ru) although other elements can be employed, e.g., titanium (Ti), vanadium (V), chromium (Cr), zirconium (Zr), hafnium (Hf), rhodium (Rh), osmium (Os) and iridium (Ir). The reflow material 26 can be deposited using a chemical vapor deposition (CVD) process, although other deposition processes may be employed. The reflow material 26 can be deposited in a layer of a few nanometers, e.g., about 1-10 nm, with thinner (2-4 nm) layers being preferred. However, thinner layers may needed more deposition/reflow cycles as will be described.

Figure 4:
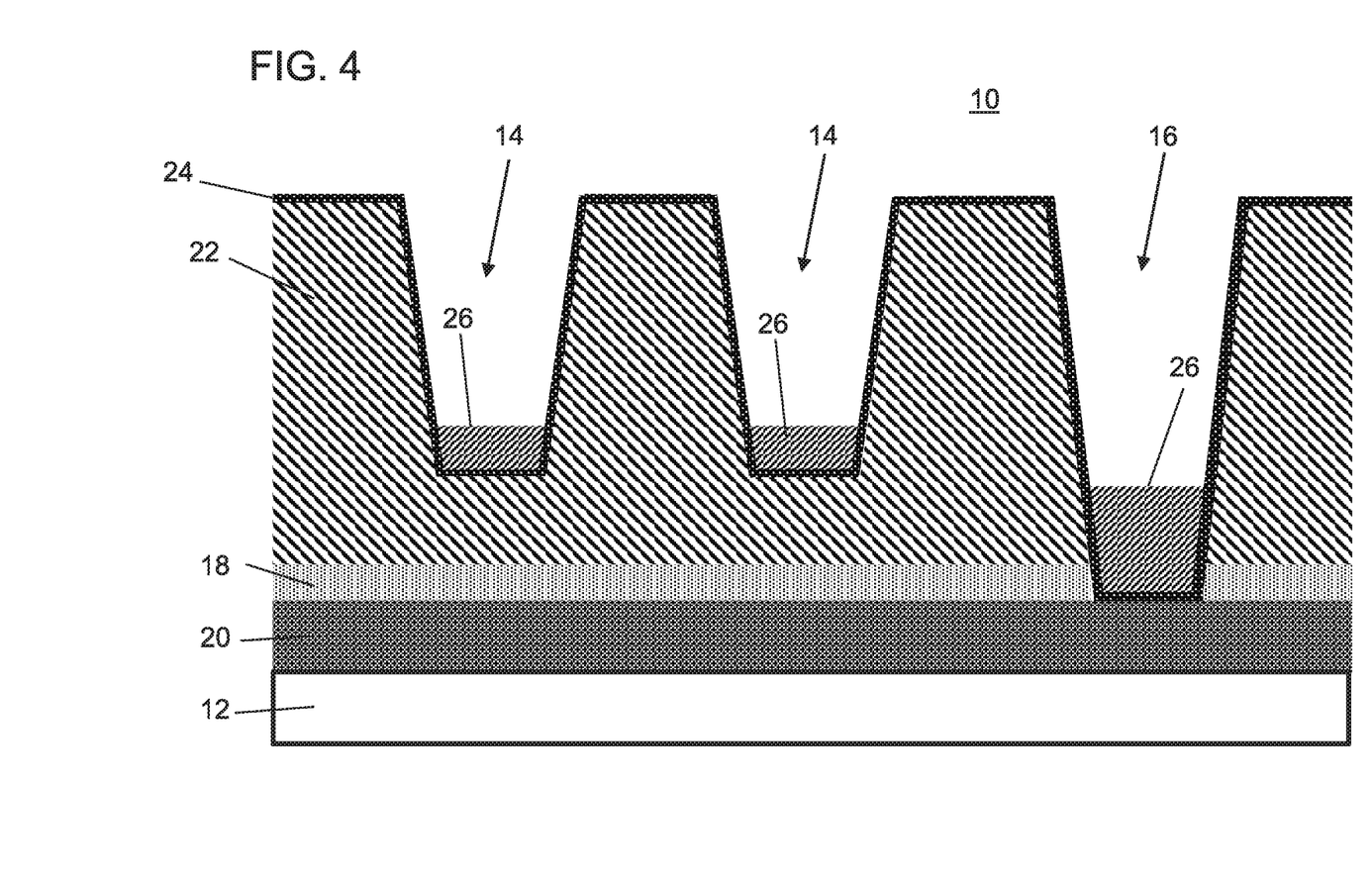
FIG. 4 is a cross-sectional view of the semiconductor device of FIG. 3 showing the reflow material reflowed to collect in the trenches or openings of different depths in accordance with an embodiment of the present invention.

Referring to FIG. 4, a reflow process is performed to flow the reflow material 26. The reflow material 26 flows without melting due to surface tension and the surface properties of the reflow liner 24. The reflow liner 24 includes a higher melting temperature and maintains its solid form while the reflow material 26 collects in dells, depressions or trenches (openings 14, 16) formed in the dielectric layer 22. The reflow process includes a heat treatment below the melt temperature of the reflow material 26. In one embodiment, the reflow temperature can be between about 300° C. to about 800° C. when Ru is employed (Ru has a melting point of 2250° C.). Other temperatures below the melting point of the reflow material 26 can also be employed and the process times adjusted accordingly.

Figure 5:
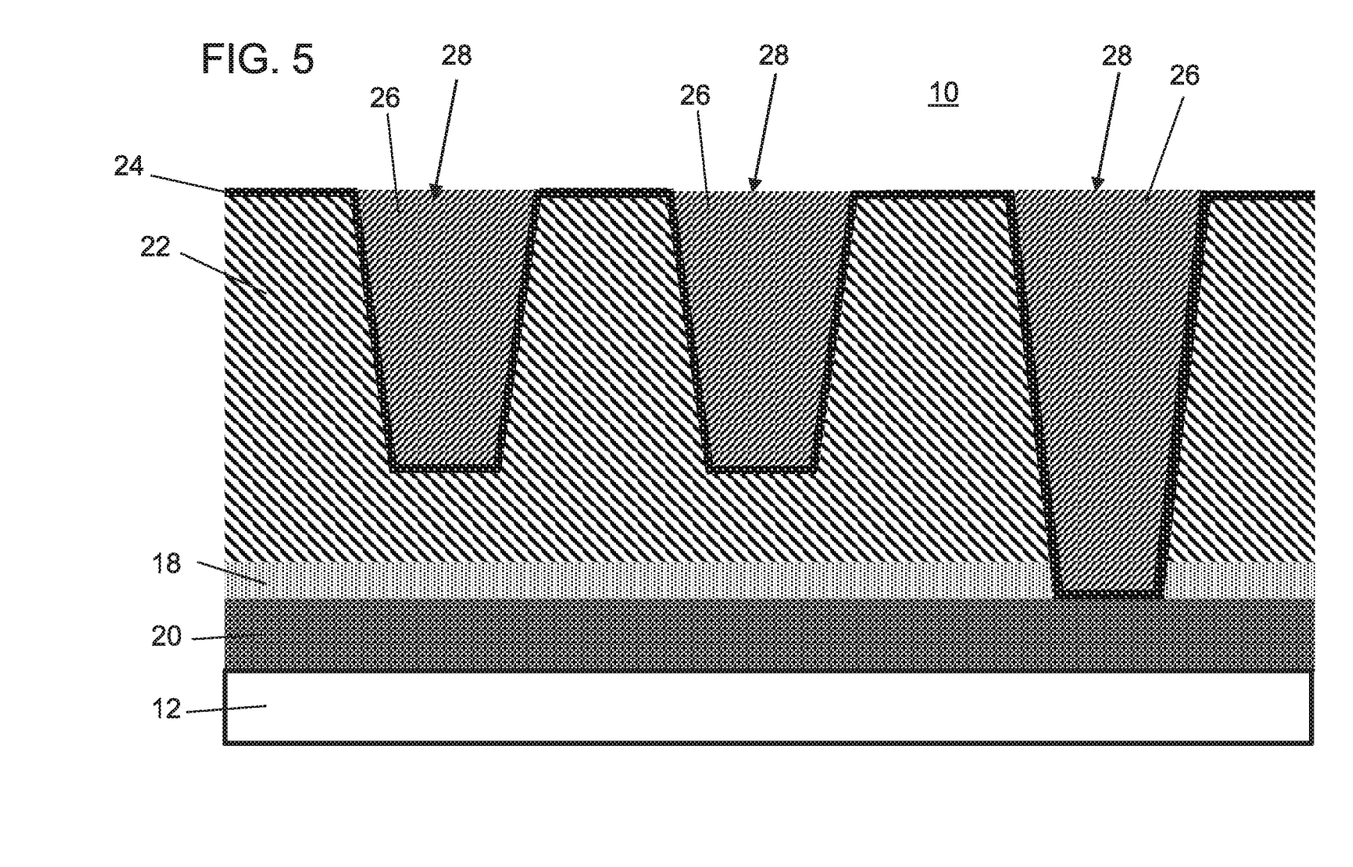
FIG. 5 is a cross-sectional view of the semiconductor device of FIG. 4 showing the reflow material reflowed to collect in the trenches after one or more additional deposition and reflow steps to form an aggregate reflow that fills the trenches in accordance with an embodiment of the present invention.

Referring to FIG. 5, the deposition and reflow processes as described with reference to FIGS. 3 and 4 are sequentially repeated. Each time the reflow process is performed the openings 14, 16 are incrementally filled with newly deposited reflow material 26. The openings 14, 16 are then completely filled or overfilled with reflow material 26 until a reflowed aggregate 28 is formed from the reflow material 26. The aggregate 28 includes a number of portions of reflow material 26 collectively forming an interconnect or other conductive structure of a high melting point metal that is otherwise difficult to process to form an interconnect or other conductive structure, especially in small spaces (e.g., widths of 20 nm or less). The reflow processing significantly saves thermal budget, which would otherwise be exceeded by the formation of a high temperature metal. For example, reflow processing can be performed between about 300° C. to about 800° C. for Ru instead of at its melting point of about 2250° C.

Figure 6:
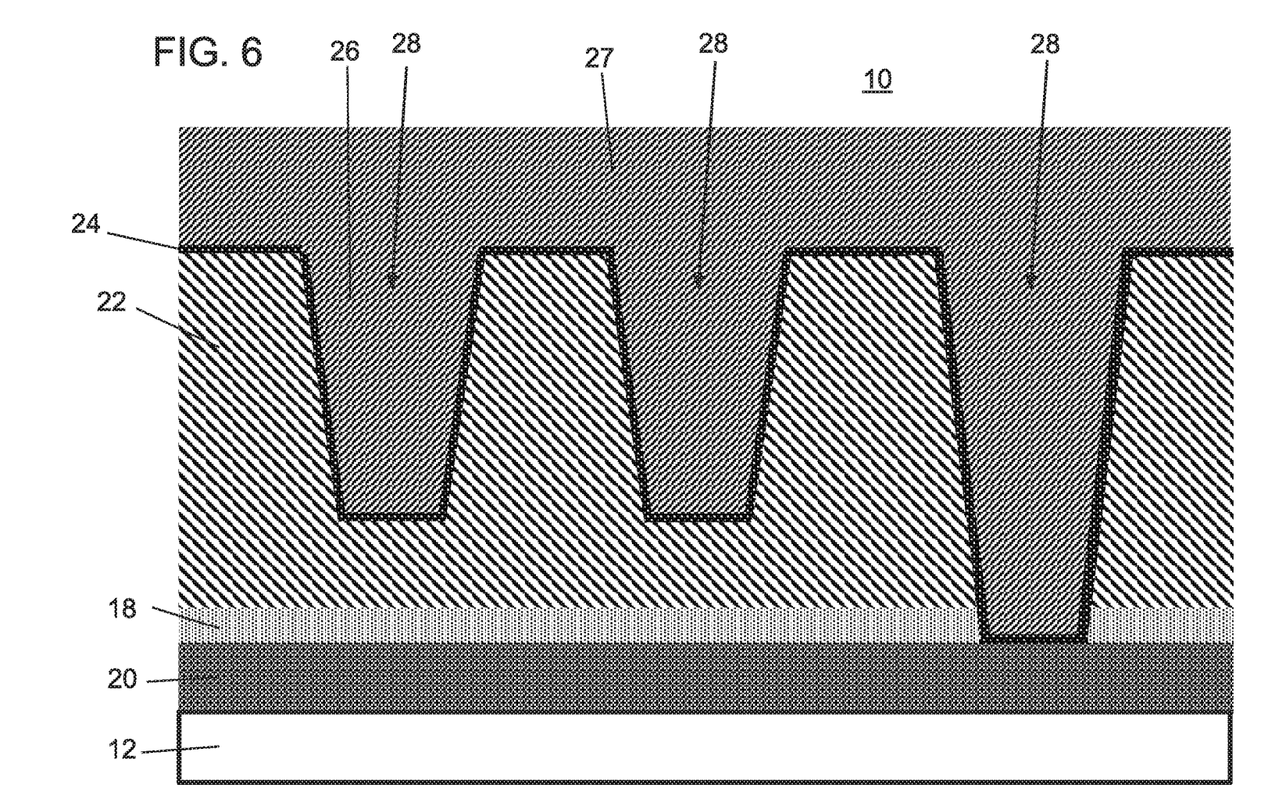
FIG. 6 is a cross-sectional view of the semiconductor device of FIG. 5 showing an overburden layer formed from the same reflow material formed on the aggregate reflow that overburdens the trenches in accordance with an embodiment of the present invention.

Referring to FIG. 6, an overburden 27 deposition process is performed to fill in any gaps and to provide additional reflow material 26 on the aggregates 28 formed in the openings 14, 16. The overburden process is optional. An anneal process is performed to make the aggregates 28 more uniform, relieve stress and minimize gaps and other non-uniformities in the reflow material 26. The anneal process can include an anneal between about 600° C. to about 1600° C. for a few seconds to a few hours depending on the materials employed and the characteristics desired.

Figure 7:
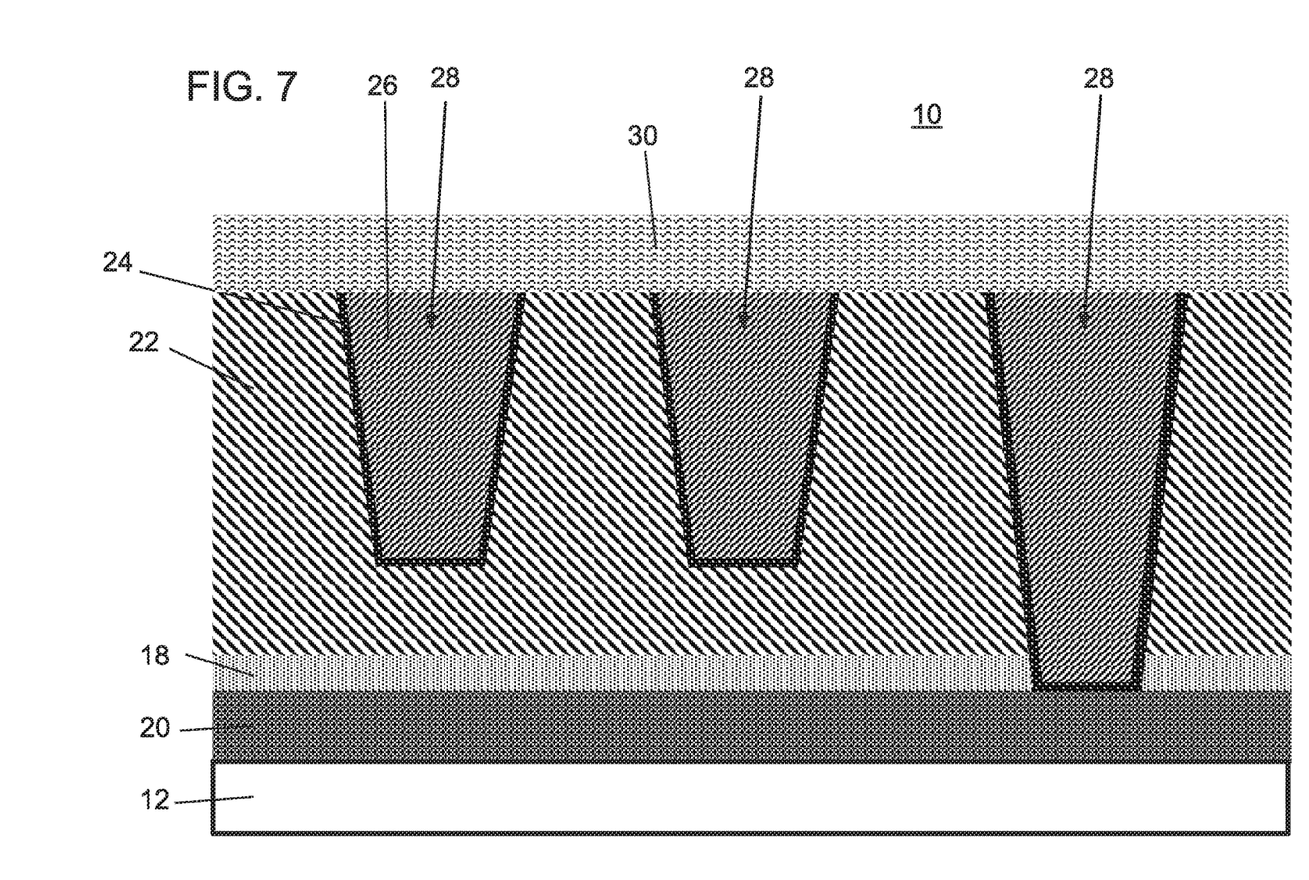
FIG. 7 is a cross-sectional view of the semiconductor device of FIG. 6 showing the overburden layer planarized and a cap layer formed over the reflow material of the aggregate reflow that fills the trenches to form conductive structures in accordance with an embodiment of the present invention.

Referring to FIG. 7, a planarization process may be performed, which can include an etch process or a chemical mechanical polish process (CMP) to planarize and remove the overburden reflow material 26 on the aggregate 28. The planarization process can stop on the dielectric layer 22. The planarization process is a lower temperature process. The reflow liner 24 remains within the openings 14, 16 and can form an interface with the metal layer 20, as needed, or a diffusion barrier, if present.

Processing can continue with the formation of interlevel dielectric layers, additional interconnects or metallizations or the formation of a cap layer 30. The cap layer 30 includes a dielectric layer such as SiN or other material. The cap layer selected depends on subsequent processing. Additional metal layers or structures can be formed using the deposition and reflow methods as described. These metal layers can include high melting temperature materials, such as Ru, that are otherwise difficult to employ in such metal structures.

Figure 8:
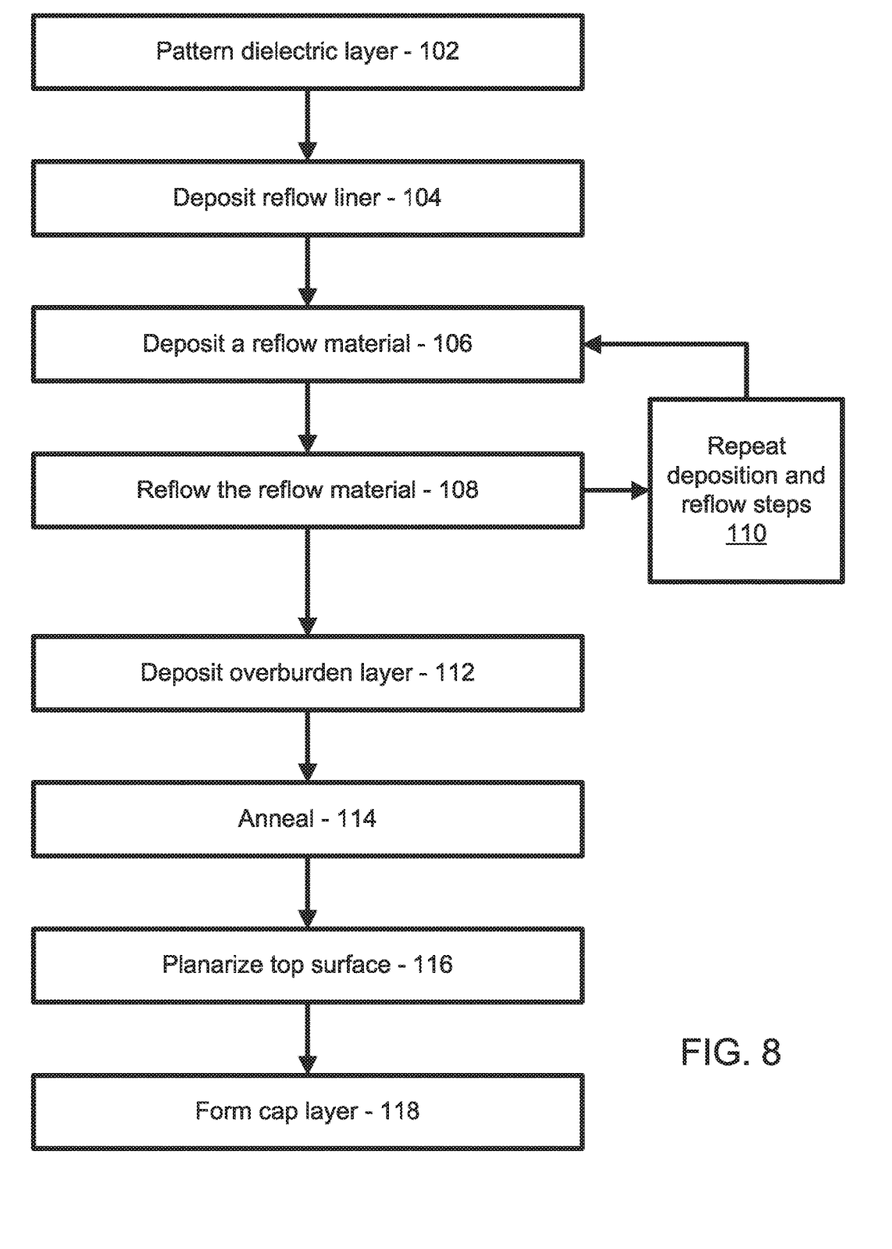
FIG. 8 is a block/flow diagram showing methods for forming conductive structures for a semiconductor device that include high melting point metal materials in accordance with embodiments of the present invention.

Referring to FIG. 8, methods for forming conductive structures for a semiconductor device are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a dielectric layer is formed over a substrate and is patterned to form trenches for conductive structures. The dielectric layer can be formed on one or more metal layers, cap layers, semiconductor layers, substrates or substrate layers, etc. The substrate can include a semiconductor wafer or chip and include multiple layers of different materials and structures. Patterning the dielectric layer can include lithographic processing or any other patterning technique.

In block 104, a reflow liner is deposited on walls of trenches formed in a dielectric layer. The reflow liner is formed as a continuous layer and can be conformally deposited. In one embodiment, the reflow liner includes tungsten. The tungsten can be formed using a liner-less deposition process. Other metals such as refractory metals can also be employed. The liner layer preferably includes a high melting point metal. In one embodiment, the high melting point of the reflow liner includes a higher melting point than the reflow materials. The reflow liner includes a metal that functions as a surface tension launch layer that enables the reflow of the reflow material without the reflow material sticking to the reflow liner. The reflow liner needs to remain resistant to reflow while reflowing a reflow material as described in the next step.

In block 106, a reflow material is conformally deposited on the reflow liner. The reflow material can be deposited using a CVD process, although other deposition processes can be employed. The reflow material can be conformally deposited and is thin enough to permit reflow using low temperatures (e.g., significantly less that the high melting temperature of the material).

In block 108, the reflow material is reflowed to collect the reflow material in at the bottoms of the trenches. In one embodiment, the reflow material formed on the reflow liner includes ruthenium (Ru). The reflow material reflows at a temperature lower than a melting point of the reflow material. In one embodiment, the reflow material includes Ru and reflowing the reflow material includes a reflow temperature of between about 300° C. and 800° C.

In block 110, the conformal deposition and the reflow steps are repeated until the trenches are aggregately filled with the reflow material. This can take a plurality of cycles. The trenches can be completely or partially filled as needed. The aggregate builds up on previous depositions until the trenches are appropriately or completely filled.

In block 112, in one embodiment, an overburden layer of reflow material can be deposited over the aggregately filled trenches. The overburden layer can be deposited using a CVD deposition, although other deposition processes can be employed. The overburden ensure complete filling and provided protection of the reflow material during an anneal process.

In block 114, the reflow material, the overburden layer and the aggregately filled trenches can be annealed to remove gaps and non-uniformities in the reflow material. The anneal process can also be employed to increase grain size and reduce resistivity of the newly formed aggregated conductive structures.

In block 116, the reflow material can be planarized to form conductive structures in the trenches. Planarizing can include removing the overburden layer down to the dielectric layer. The planarizing can include etching or CMP. The planarizing is preferably employed at a low temperature.

In block 118, a cap layer or other structures can be formed over the planarized surface. The structures can include additional metal layers and structures, dielectric layers, etc. Processing continues to form additional metal structures, etc. and to complete the semiconductor device being fabricated. In one example, via formation or other interconnects are formed by depositing a conductive metal into via holes formed within another dielectric layer formed over the dielectric layer (22) using deposition methods, such as chemical vapor deposition (CVD), sputtering or plating. The conductive metal may include, but is not limited to: tungsten, copper, aluminum, silver, gold and alloys thereof or can be formed using the deposition ad reflow processes described in accordance with the present embodiments.

Having described preferred embodiments for reflow interconnect using Ru (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A conductive structure for a semiconductor device, comprising:
    a reflow liner formed on walls of trenches in a dielectric layer, the reflow liner including a metal that serves as a surface tension launch layer to enable reflow of a reflow material; and
    an aggregated reflow material formed of the reflow material on the reflow liner and collected in the trenches to aggregately form the conductive structure in the trenches, the aggregated reflow material including a metal.

2. The structure as recited in claim 1, wherein the reflow liner includes a melting point greater than that of the reflow material.

3. The structure as recited in claim 1, wherein the reflow liner includes tungsten and the reflow material includes ruthenium.

4. The structure as recited in claim 1, wherein the reflow liner includes a melting temperature of greater than 1850 degrees C.

5. The structure as recited in claim 1, wherein the reflow liner interfaces with a metal layer to form an interconnect.

6. The structure as recited in claim 1, wherein the reflow material includes ruthenium with a reflow temperature of between about 300 and 800 degrees C.

7. The structure as recited in claim 1, wherein the reflow liner includes a metal selected from the group consisting of niobium, molybdenum, tantalum and rhenium.

8. The structure as recited in claim 1, wherein the trenches include a plurality of depths in the dielectric layer.

9. The structure as recited in claim 1, wherein the trenches include widths of 20 nm or less.

10. The structure as recited in claim 1, wherein the trenches include a plurality of depths in the dielectric layer.

11. The structure as recited in claim 1, wherein the trenches include widths of 20 nm or less.

12. A conductive structure for a semiconductor device, comprising:
    a substrate;
    a dielectric layer formed on the substrate;
    one or more openings formed in the dielectric layer to form trenches in the dielectric layer;
    a reflow liner formed on walls of the trenches in the dielectric layer, the reflow liner including a metal that serves as a surface tension launch layer to enable reflow of a reflow material; and
    an aggregated reflow material formed of the reflow material on the reflow liner and collected in the trenches to aggregately form the conductive structure in the trenches, the aggregated reflow material including a metal.

13. The structure as recited in claim 12, wherein the reflow liner includes a melting point greater than that of the reflow material.

14. The structure as recited in claim 12, wherein the reflow liner includes tungsten and the reflow material includes ruthenium.

15. The structure as recited in claim 12, wherein the reflow liner includes a melting temperature of greater than 1850 degrees C.

16. The structure as recited in claim 12, wherein the reflow liner interfaces with a metal layer to form an interconnect.

17. The structure as recited in claim 12, wherein the reflow material includes ruthenium with a reflow temperature of between about 300 and 800 degrees C.

18. The structure as recited in claim 12, wherein the reflow liner includes a metal selected from the group consisting of niobium, molybdenum, tantalum and rhenium.

* * * * *